US012356777B2

(12) United States Patent
Sim et al.

(10) Patent No.: US 12,356,777 B2
(45) Date of Patent: Jul. 8, 2025

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Ki Dong Sim, Gyeonggi-do (KR); Dong Joo Park, Incheon (KR); Jin Young Khim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 18/085,044

(22) Filed: Dec. 20, 2022

(65) Prior Publication Data

US 2023/0117746 A1    Apr. 20, 2023

Related U.S. Application Data

(62) Division of application No. 16/875,816, filed on May 15, 2020, now Pat. No. 11,545,604.

(51) Int. Cl.
| | | |
|---|---|---|
| *H10H 20/855* | (2025.01) | |
| *H10F 71/00* | (2025.01) | |
| *H10F 77/00* | (2025.01) | |
| *H10F 77/40* | (2025.01) | |
| *H10F 77/50* | (2025.01) | |
| *H10H 20/85* | (2025.01) | |
| *H10H 20/857* | (2025.01) | |
| *H10H 20/01* | (2025.01) | |

(52) U.S. Cl.
CPC .......... *H10H 20/855* (2025.01); *H10F 71/00* (2025.01); *H10F 77/407* (2025.01); *H10F 77/50* (2025.01); *H10F 77/93* (2025.01); *H10H 20/8506* (2025.01); *H10H 20/857* (2025.01); *H10H 20/0363* (2025.01); *H10H 20/0364* (2025.01)

(58) Field of Classification Search
CPC ........... H01L 27/14618; H01L 27/1203; H01L 27/14627; H01L 2924/0002; H01L 27/14636; H01L 25/0753; H01L 2924/00; H01L 2224/73265; H01L 2924/00014
See application file for complete search history.

(56) References Cited

U.S. PATENT DOCUMENTS

| | | |
|---|---|---|
| 2008/0237766 A1 | 10/2008 | Kim |
| 2012/0156823 A1 | 6/2012 | Myung et al. |
| 2021/0084747 A1 | 3/2021 | Schrems et al. |

FOREIGN PATENT DOCUMENTS

CN    110710196 A    1/2020

OTHER PUBLICATIONS

Office Action for Taiwan Application No. 110115592 mailed Apr. 30, 2025.

*Primary Examiner* — Tony Tran
(74) *Attorney, Agent, or Firm* — Spectrum IP Law Group LLC

(57) ABSTRACT

In one example, a semiconductor device comprises a spacer substrate, a first lens substrate over the first spacer substrate, and a lens protector over the first lens dielectric adjacent to the first lens. The spacer substrate comprises a spacer dielectric, a spacer top terminal, a spacer bottom terminal, and a spacer via. The first lens substrate comprises a first lens dielectric, a first lens, a first lens top terminal, a first lens bottom terminal, and a first lens via. A first interconnect is coupled with the spacer top terminal and the first lens bottom terminal. Other examples and related methods are also disclosed herein.

10 Claims, 12 Drawing Sheets

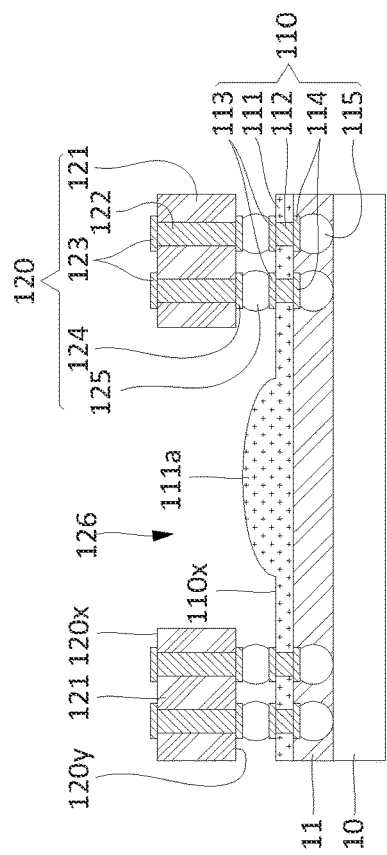
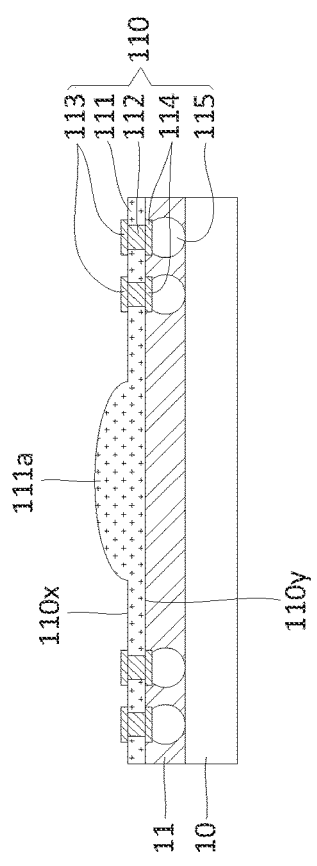

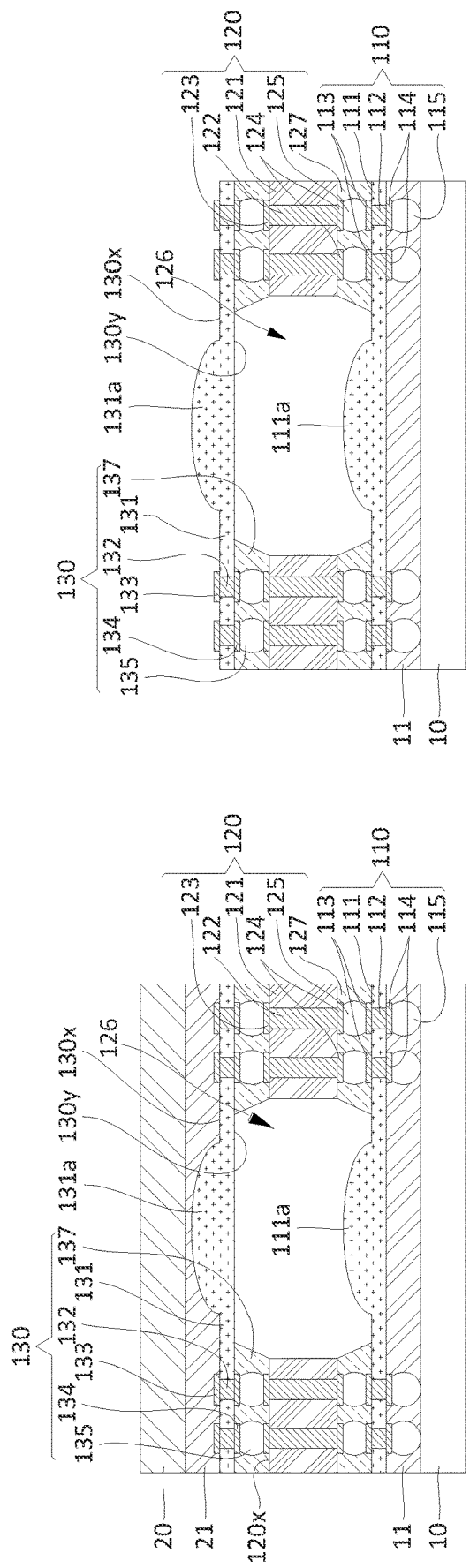

SEMICONDUCTOR DEVICES AND METHODS OF MANUFACTURING SEMICONDUCTOR DEVICES

CROSS-REFERENCE TO RELATED APPLICATIONS

The present application is a divisional of U.S. application Ser. No. 16/875,816 filed May 15, 2020. Said application Ser. No. 16/875,816 and US Pub. No. 2021/0359175 A1 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2M show cross-sectional views of an example method for manufacturing an example semiconductor device.

Figure 1:
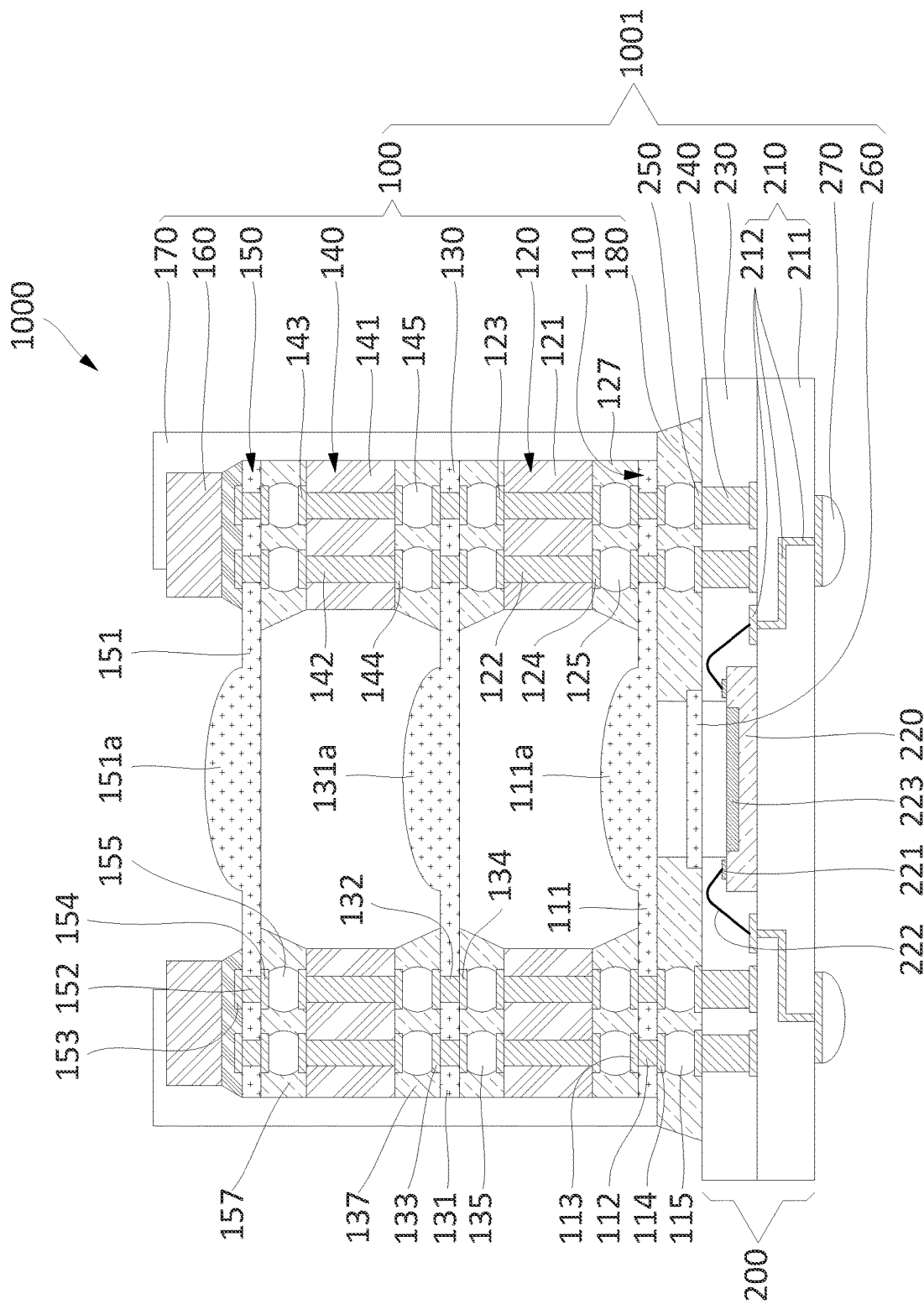
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a spacer substrate comprising, a spacer dielectric, a spacer top terminal on a top side of the spacer substrate, a spacer bottom terminal on a bottom side of the spacer substrate, and a spacer via in the spacer dielectric and coupled with the spacer top terminal and the spacer bottom terminal. The semiconductor device also comprises a first lens substrate over the first spacer substrate, the first lens substrate comprising, a first lens dielectric, a first lens, a first lens top terminal on a top side of the first lens dielectric, a first lens bottom terminal on a bottom side of the first lens dielectric, and a first lens via in in the first lens dielectric and coupled with the first lens top terminal and the first lens bottom terminal. In addition, the semiconductor device comprises a lens protector over the first lens dielectric adjacent to the first lens; and a first interconnect coupled with the spacer top terminal and the first lens bottom terminal.

In another example, a semiconductor device, comprises a first lens substrate, comprising a first lens dielectric, a first lens over the first lens dielectric, and a lens top terminal on a top side of the first lens dielectric. The semiconductor device also comprises a spacer substrate over the first lens substrate, the spacer substrate comprising a spacer dielectric, a spacer top terminal, and a spacer bottom terminal. The semiconductor device also comprises a second lens substrate over the spacer substrate, the second lens substrate comprising a second lens dielectric, a second lens over the second lens dielectric, and a lens bottom terminal on a bottom side of the second lens dielectric. In addition, the semiconductor device comprises a first interconnect coupled with the lens top terminal and the spacer bottom terminal and a second interconnect coupled with the spacer top terminal and the lens bottom terminal, wherein the first lens has a first optical characteristic and the second lens has a second optical characteristic different than the first optical characteristic.

In a further example, a method to manufacture a semiconductor device comprising providing a first lens substrate having a first lens, providing a first spacer substrate facing the first lens substrate, and coupling the first lens substrate and the first spacer substrate with a first interconnect. The first lens substrate comprises a first lens via and a first lens terminal coupled to the first lens via, the first spacer substrate comprises a first spacer via and a first spacer terminal coupled to the first spacer via, and the first interconnect couples the first lens terminal with the first spacer terminal.

Other examples are included in the present disclosure. Such examples may be found in the figures, in the claims, or in the description of the present disclosure.

FIG. 1 shows a cross-sectional view of an example semiconductor device 1000. In the example shown in FIG. 1, semiconductor device 1000 can comprise lens unit 100 and base unit 200. Lens unit 100 can comprise lens substrates 110, 130, or 150, spacer substrates 120 or 140, lens protector 160, encapsulant 170, or underfill 180.

Lens substrates 110, 130, or 150 can comprise dielectrics 111, 131, or 151 and self-alignment features such as vias 112, 132, or 152, lens top terminals 113, 133, or 153, lens bottom terminals 114, 134, or 154, or interconnects 115, 135, or 155. Dielectrics 111, 131, or 151 can comprise or be coupled with lenses 111a, 131a, or 151a. Spacer structures 120 or 140 can comprise dielectric walls 121 or 141, and self-alignment features such as vias 122 or 142, spacer top terminals 123 or 143, spacer bottom terminals 124 or 144, or interconnects 125 or 145. In some examples, spacer substrates 120 or 140 can comprise a spacer dielectric 121 or 141, a spacer top terminal 123 or 143 on a top side of the spacer substrate 120 or 140, a spacer bottom terminal 124 or 144 on a bottom side of the spacer substrate 120 or 140, and a spacer via 122 or 142 in the spacer dielectric 121 or 141 and coupled with the spacer top terminal 123 or 143 and the spacer bottom terminal 124 or 144.

The provision of self-alignment features can permit automatic alignment of lenses 111a, 131a, or 151a with each other when lens substrates 110, 130, or 150 and spacer structures 120 or 140 are coupled to each other through such self-alignment features. In some examples, the self-alignment features do not conduct electric signals through or within lens unit 100. In some examples, lens substrate 110, 130, or 150 can be over or can face spacer substrate 120 or 140. Lens substrate 110, 130, or 150 can comprise lens dielectric 111, 131, or 151, lens 111a, 131a, or 151a, lens top terminal 113, 133, or 153 on a top side of lens dielectric 111, 131, or 151, and lens via 112, 132, or 152 in lens dielectric 111, 131, or 151 and coupled with lens top terminal 113, 133, or 153 and with lens bottom terminals 114, 134, or 154.

Base unit 200 can comprise base substrate 210, electronic component 220, interface element 223, encapsulant 230, lid 260, base bottom terminals 270, and self-alignment features such as vertical interconnects 240 or base top terminals 250 on a top side of encapsulant 230. In some examples, via or vertical interconnect 240 can couple with base top terminal 250 on a top side of encapsulant 230. Lens substrate 110, 130, or 150 can be over base substrate 210. Base substrate 210 can comprise dielectric structure 211 having one or more dielectric layers, and conductive structure 212 having one or more conductive layers. Encapsulant 230 can be over dielectric structure 211 and can contact a side of electronic component 220. Electronic component 220 can comprise terminals 221 and interface element 223. Internal interconnects 222 can couple electronic component 220 with conductive structure 212 of base substrate 210.

The provision of self-alignment features can permit automatic alignment of lenses 111a, 131a, or 151a with lid 260 or with interface element 223 when lens unit 100 and base unit 200 are coupled together through such self-alignment features. In some examples, the self-alignment features do not conduct electric signals between lens unit 100 and base unit 200.

Base substrate 210, encapsulant 230, vertical interconnects 240, base top terminals 250, lid 260, and base bottom terminals 270 of base unit 200 can comprise or be referred to as a semiconductor package, and when combined with lens unit 100, can be referred to as semiconductor package 1001 or package 1001. Package 1001 can provide protection for electronic component 220 from external elements or environmental exposure. Semiconductor package 1001 can provide electrical couplings between an external component and electronic component 220.

Figure 2D:
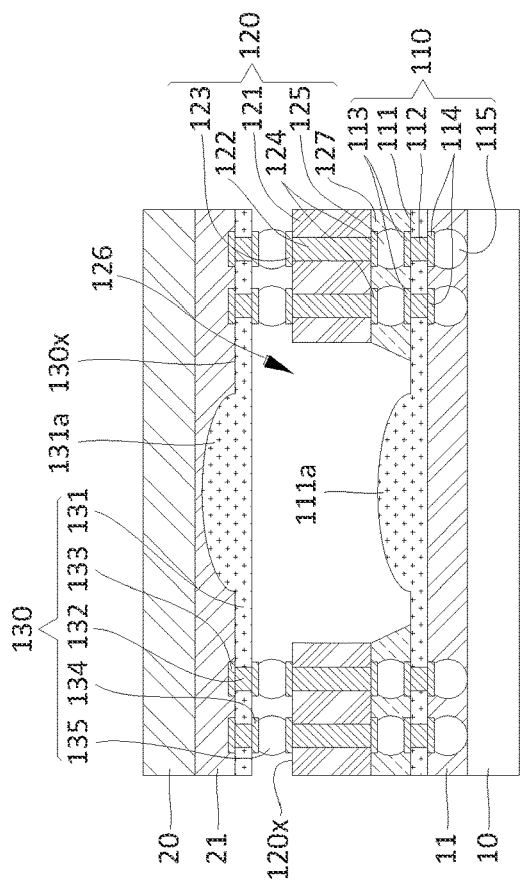

FIGS. 2A to 2M show cross-sectional views of an example method for manufacturing an example semiconductor device. FIG. 2A shows a cross-sectional view of semiconductor device 1000 at an early stage of manufacture. In the example shown in FIG. 2A, bottom side 110y of lens substrate 110 can be attached to carrier 10. Although one lens substrate 110 attached to carrier 10 is shown, multiple lens substrates 110 can be arranged and attached on carrier 10 to be spaced apart from one another in a row-wise direction or in a column-wise direction.

Lens substrate 110 can comprise dielectric 111, vias 112, lens top terminals 113, lens bottom terminals 114, and interconnects 115. Top side and bottom side of dielectric 111 can be along top side 110x or bottom side 110y of lens substrate 110, respectively. Lens 111a can be positioned roughly at the center of top side 110x or bottom side 110y of dielectric 111. Lens 111a can upwardly protrude or can be downwardly recessed into dielectric 111. Lens 111a can be monolithic with lens substrate 110 or can be formed or coupled on lens substrate 110. In some examples, lens 111a and dielectric 111 can be monolithic or can comprise a same material. In some examples, lens 111a and dielectric 111 can be distinct from each other or can comprise different materials. Dielectric 111 can be a panel having substantially planar top side 110x and bottom side 110y at the exterior edges of lens 111a. Dielectric 111 can comprise or be referred to as glass, silicon, plastic, or a transparent material. Dielectric 111 can have a width in the range of about 1 millimeter (mm) to about 1,000 mm, or a thickness in the range of about 1 micrometer (μm) to about 100 μm. Dielectric 111 can be a core layer allowing lens substrate 110 to be maintained at a substantially planar state.

Vias 112 can be exposed at top and bottom sides 110x and 110y of dielectric 111 to couple lens top terminals 113 with lens bottom terminals 114. In some examples, vias 112 can comprise or be referred to as through glass vias (TGVs), through silicon vias (TSVs), conductive vias, or conductive posts. In some examples, vias 112 can comprise a metallic material, such as copper, iron, nickel, gold, silver, palladium, or tin. In some examples, vias 112 can comprise an insulating material, such as a plug material. In some examples, vias 112 can have a thickness in the range of about 1 μm to about 100 mm.

Lens top terminals 113 can be provided on top side 110x of dielectric 111, and lens bottom terminals 114 can be provided on bottom side 110y of dielectric 111. Lens top terminals 113 and lens bottom terminals 114 can be provided in a matrix configuration having rows or columns. In some examples, lens top terminals 113 and lens bottom terminals 114 can comprise or be referred to as conductive lands, conductive pads, wiring pads, or micropads. In some examples, lens top terminals 113 and lens bottom terminals 114 can comprise copper, iron, nickel, gold, silver, palladium, or tin. In some examples, lens top terminals 113 or lens bottom terminals 114 can have a thickness, a width, or a space ranging of about 1 μm to about 100 mm.

Interconnects 115 can be coupled to bottom sides of lens bottom terminals 114. Interconnects 115 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, interconnects 115 can be provided by a solder-containing conductive material to bottom sides of lens bottom terminals 114 through a ball-drop process, followed by performing a reflow process. Interconnects 115 can comprise or be referred to as conductive balls such as solder balls, conductive pillars such as copper pillars, or conductive posts having solder caps on copper pillars. Interconnects 115 can have a diameter in the range of about 1 μm to about 10 mm.

Carrier 10 can be substantially planar. In some examples, carrier 10 can comprise or be referred to as board, a wafer, a panel, a semiconductor, or a strip. In some examples, carrier 10 can comprise steel, stainless steel, aluminum, copper, ceramic, glass, or a wafer. Carrier 10 can have a width in the range of about 10 mm to about 10,000 mm and a thickness in the range of about 1 mm to about 1,000 mm. Carrier 10 can function to integrally handle multiple components during attachment of lens substrate 110, placement of spacer substrates 120 and 140, placement of lens substrates 130 and 150 and attachment of lens protector 160. Carrier 10 can be commonly applied to some examples of the present disclosure.

Temporary bond film 11 can be provided on a side of carrier 10. Temporary bond film 11 can be bonded to bottom side 110y of dielectric 111 to cover lens bottom terminals 114 and interconnects 115. Temporary bond film 11 can be brought into contact with bottom side 110y of dielectric 111, lens bottom terminals 114, and interconnects 115. Temporary bond film 11 can comprise a thermally releasable tape or film or a photo-releasable tape or film, where adhesiveness can be weakened or removed by heat or light. In some examples, the adhesiveness of temporary bond film 11 can be weakened or removed by physical or chemical external force. The thickness of temporary bond film 11 can range of about 1 μm to about 10 mm. Temporary bond film 11 can permit carrier 10 to be separated at a later stage. Temporary bond film 11 can be commonly applied to some examples of the present disclosure.

FIG. 2B shows a cross-sectional view of semiconductor device 1000 at a later stage of manufacture. In the example shown in FIG. 2B, interconnects 125 of spacer substrate 120 can be coupled to lens top terminals 113 of lens substrate 110 to couple lens substrate 110 with spacer substrate 120. Spacer substrate 120 can comprise dielectric wall 121, vias 122, spacer top terminals 123, spacer bottom terminals 124, interconnects 125, and spacer cavity 126. Spacer cavity 126 can penetrate top side 120x and bottom side 120y of spacer substrate 120. Spacer cavity 126 can be provided at central portion of spacer substrate 120. Dielectric wall 121 of spacer substrate 120 can define a ring shape, such as a circular ring or rectangular ring. Lens 111a of lens substrate 110 can be exposed through spacer cavity 126 of spacer substrate 120. Spacer substrate 120 can adjust a distance between, for example, lens substrate 110 and lens substrate 130. In some examples, spacer substrate 120 can have a thickness in the range of about 1 μm to about 100 mm.

In some examples, spacer substrate 120 can comprise or be referred to as a laminate substrate, a pre-formed substrate, a printed circuit board, a cavity substrate printed wiring board, a single-layered or multi-layered substrate, a through hole substrate, a glass epoxy substrate, a polyimide substrate, a polyester substrate, a molded plastic substrate, or a ceramic substrate.

In some examples, dielectric wall 121 can have substantially planar top and bottom sides. The top and bottom sides of dielectric wall 121 can be along top and bottom sides 120x and 120y of spacer substrate 120, respectively. In some examples, spacer cavity 126 penetrating top side 120x and bottom sides 120y of spacer substrate 120 can be provided at a central portion of dielectric wall 121. Dielectric wall 121 can comprise or be referred to as one or more dielectric layers. In some examples, one or more of such dielectric layers can comprise or be referred to as a core layer, such as a fiber-reinforced core layer. In some examples, dielectric wall 121 can comprise an epoxy resin, a phenol resin, fiberglass-reinforced epoxy, polyimide, polyester, an epoxy molding compound, or a ceramic. Dielectric wall 121 can allow spacer substrate 120 to be maintained at a substantially planar state.

Vias 122 can be exposed at top side 120x and bottom side 120y of dielectric wall 121 to couple spacer top terminals 123 to spacer bottom terminals 124. In some examples, vias 122 can comprise or be referred to as conductive vias or conductive posts. In some examples, vias 122 can comprise vertical wires extending through dielectric wall 121. In some examples, vias 122 can be similar to vias 112 with respect to corresponding features, elements, materials, or formation.

Spacer top terminals 123 can be provided on top side 120x of dielectric wall 121, and spacer bottom terminals 124 can be provided to bottom side 120y of dielectric wall 121. Spacer top terminals 123 can comprise or be referred to as pads, under-bump-metallurgies (UBMs), or top sides of vias 122. Spacer bottom terminals 124 can comprise or be referred to as pads, UBMs, or bottom sides of vias 122. In some examples, spacer top terminals 123 or spacer bottom terminals 124 can be similar to lens top terminals 113 or lens bottom terminals 114 with respect to corresponding features, elements, materials, or formation.

Interconnects 125 can be coupled to bottom sides of spacer bottom terminals 124. In some examples, interconnects 125 can be similar to interconnects 115 with respect to corresponding features, elements, materials, or formation.

In some examples, spacer substrate 120 can be picked up by pick-and-place equipment and then be placed on a top side of lens substrate 110. Next, interconnects 125 of spacer substrate 120 can be connected to lens top terminals 113 of lens substrate 110 using a mass reflow process, a thermal compression process, or a laser assisted bonding process. Spacer substrate 120 can be automatically aligned on lens substrate 110 while interconnects 125 are connected to lens top terminals 113.

Figure 2C:
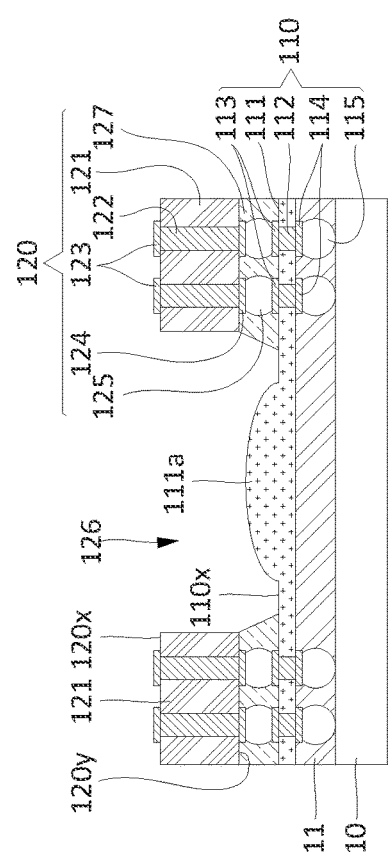

FIG. 2C shows a cross-sectional view of semiconductor device 1000 at a later stage of manufacture. In the example shown in FIG. 2C, underfill 127 can be provided between lens substrate 110 and spacer substrate 120. In some examples, underfill 127 can be injected or absorbed into the gap between top side 110x of lens substrate 110 and bottom side 120y of spacer substrate 120 by a capillary action and can then be cured. In some examples, underfill 127 can first be dispensed to cover lens top terminals 113 of lens substrate 110, and interconnects 125 of spacer substrate 120 can then penetrate underfill 127 to be coupled to lens top terminals 113. In some examples, underfill 127 can comprise or be referred to as an adhesive, a dielectric, or a nonconductive paste. In some examples, underfill 127 can comprise a filler-free resin. Underfill 127 can prevent spacer substrate 120 from being electrically disconnected from lens substrate 110 due to physical or chemical shocks.

FIG. 2D shows a cross-sectional view of semiconductor device 1000 at a later stage of manufacture. In the example shown in FIG. 2D, interconnects 135 of lens substrate 130 can be coupled to spacer top terminals 123 of spacer substrate 120. Lens substrate 130 can be picked up by pick-and-place equipment in a state where carrier 20 is attached to top side 130x of lens substrate 130, and then be placed on or over top side 120x of spacer substrate 120. In some examples, interconnects 135 of lens substrate 130 can be connected to spacer top terminals 123 of spacer substrate 120 using a mass reflow process, a thermal compression process, or a laser assisted bonding process. Lens substrate 130 can be automatically aligned on spacer substrate 130 while interconnects 135 are connected to spacer top terminals 123.

Lens substrate 130 can comprise dielectric 131, vias 132, lens top terminals 133, lens bottom terminals 134, and interconnects 135. Dielectric 131 can comprise or be coupled with lens 131a. In some examples, lens substrate 130 or lens 131a can be similar to lens substrate 110 or lens 111a with respect to corresponding features, elements, materials, or formation. Optical characteristics of lens 131a, such as magnification, filtering, or focal length, can be the same or different than optical characteristics of lens 111a. In some examples, lens substrate 130 can be over spacer substrate 120, and spacer substrate 120 can be over lens substrate 110 to provide lens 131a over and aligned with lens 111a.

Carrier 20 can comprise temporary bond film 21 provided on its bottom side. Carrier 20 can be attached to top side 130x of lens substrate 130 by temporary bond film 21. Carrier 20 functions to handle lens substrate 130. Carrier 20 can be commonly applied to some examples of the present disclosure. Carrier 20 or temporary bond film 21 can be similar to carrier 10 or temporary bond film 11 with respect to corresponding features, elements, materials, or formation.

FIG. 2E shows a cross-sectional view of semiconductor device 1000 at a later stage of manufacture. In the example shown in FIG. 2E, underfill 137 can be provided between spacer substrate 120 and lens substrate 130. In some examples, underfill 137 can be injected or absorbed into a gap between top side 120x of spacer substrate 120 and bottom side 130y of lens substrate 130 by a capillary action and can then be cured. Underfill 137 can be similar to underfill 127.

FIG. 2F shows a cross-sectional view of semiconductor device 1000 at a later stage of manufacture. In the example shown in FIG. 2F, carrier 20 can be removed from top side 130x of lens substrate 130. Temporary bond film 21 can be separated from lens substrate 130 while remaining attached to carrier 20. In some examples, adhesiveness of temporary bond film 21 can be removed or weakened by heat, light, a chemical solution, or physical external force. Accordingly, top side 130x of lens substrate 130 can be exposed.

Figure 2G:
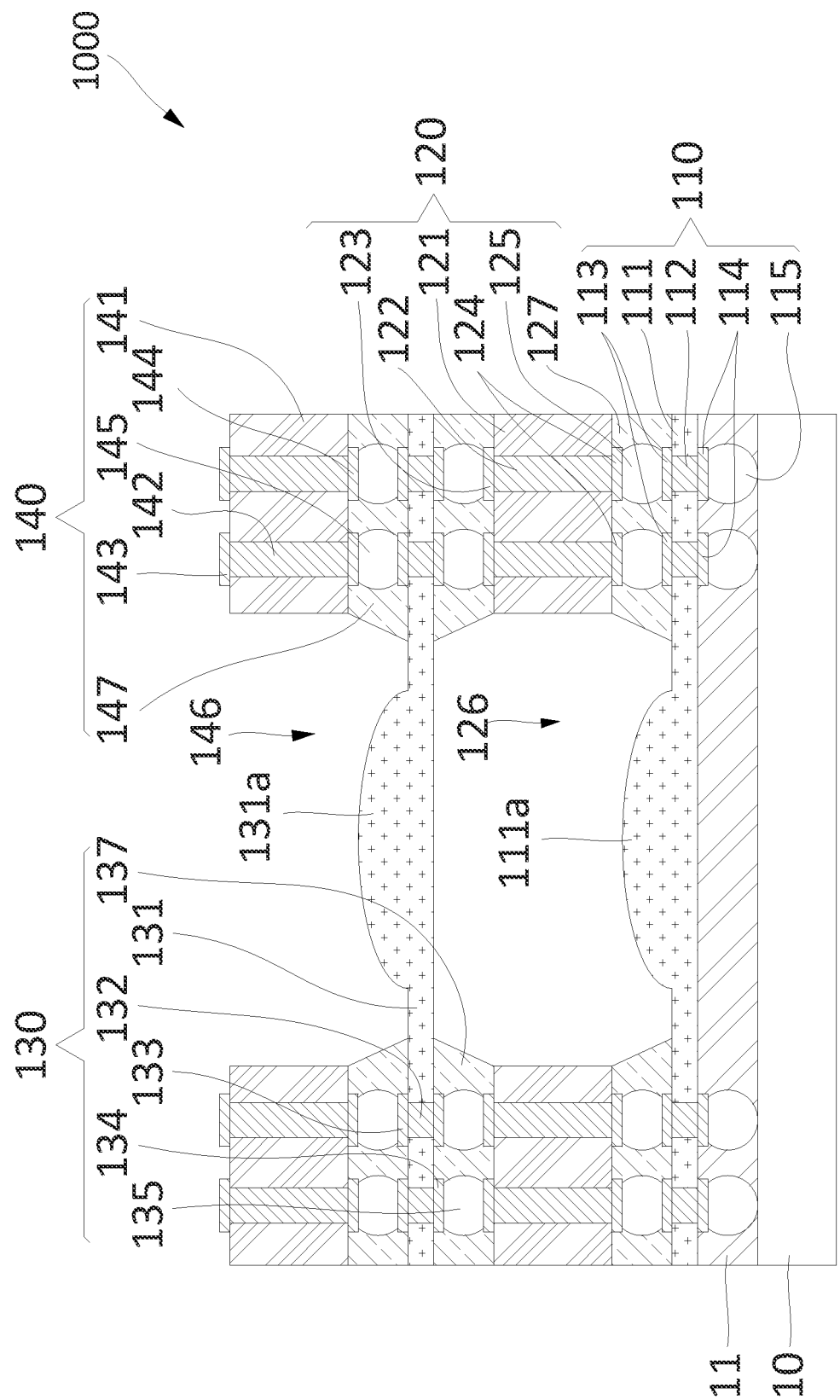

FIG. 2G shows a cross-sectional view of semiconductor device 1000 at a later stage of manufacture. In the example shown in FIG. 2G, interconnects 145 of spacer substrate 140 can be coupled with lens top terminals 133 of lens substrate 130. Spacer substrate 140 can comprise dielectric wall 141, vias 142, spacer top terminals 143, spacer bottom terminals 144, interconnects 145, spacer cavity 146, and underfill 147. Spacer substrate 140 can expose lens 131a of lens substrate 130 through spacer cavity 146.

Spacer substrate 140 can be similar to spacer substrate 120 with respect to corresponding features, elements, materials, or formation. The process of connecting interconnects 145 to lens top terminals 133 can be similar to the process of connecting interconnects 125 to lens top terminals 113 shown in FIG. 2B. Underfill 147 can be similar as underfill 127 shown in FIG. 2C.

Figure 2H:
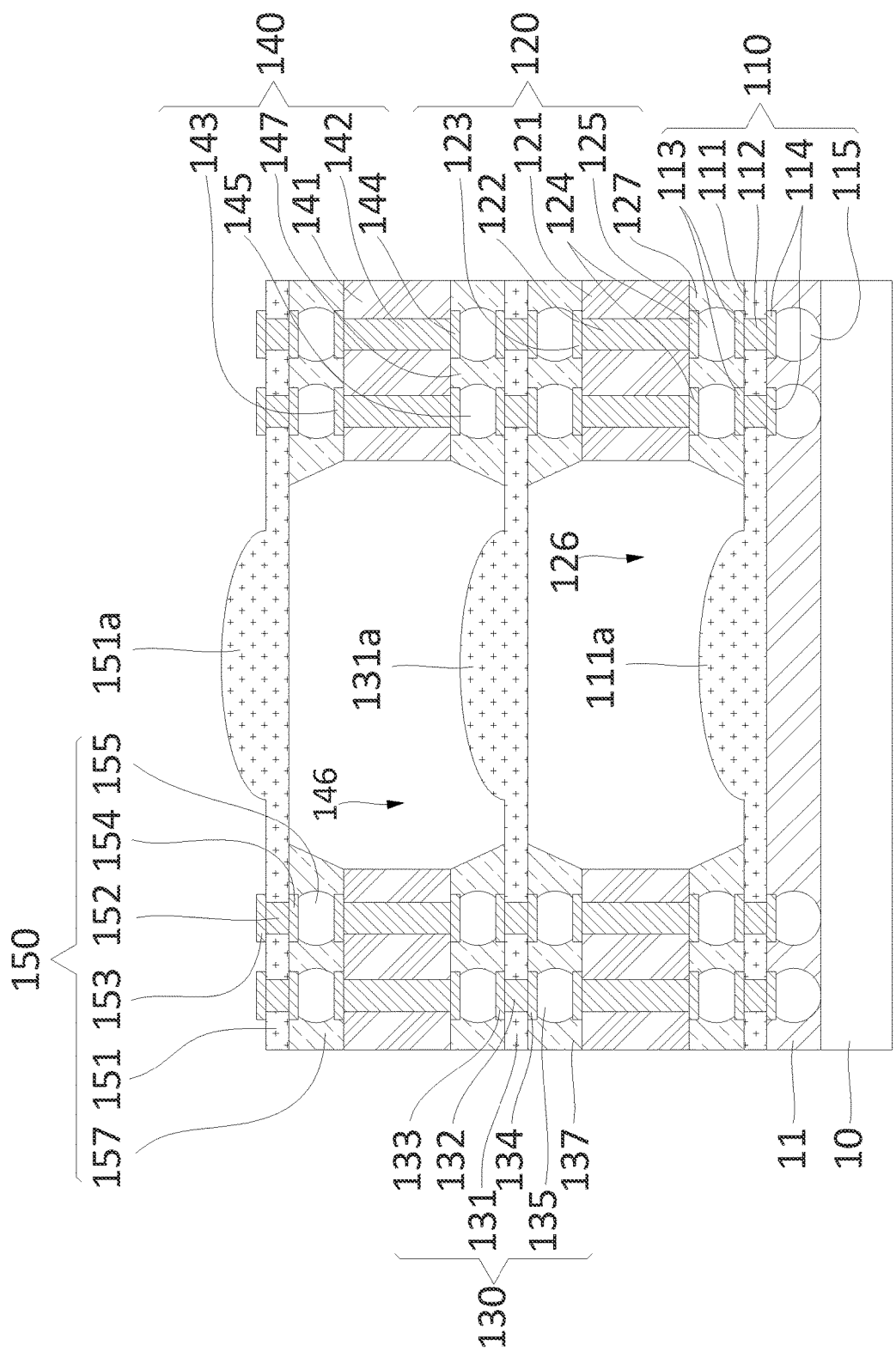

FIG. 2H shows a cross-sectional view of semiconductor device 1000 at a later stage of manufacture. In the example shown in FIG. 2H, interconnect 155 of lens substrate 150 can be coupled to spacer top terminal 143 of spacer substrate 140. Lens substrate 150 can comprise dielectric 151, vias 152, lens top terminals 153, lens bottom terminals 154, and interconnects 155. Dielectric 151 can comprise or be coupled with lens 151a. In some examples, interconnect 135 or 155 can couple spacer top terminal 123 or 143 with lens bottom terminal 134 or 154. In some examples, lens substrate 150 or lens 151a can be similar to lens substrate 110 or lens 111a with respect to corresponding features, elements, materials, or formation. Optical characteristics of lens 151a, such as magnification, filtering, or focal length, can be the same or different than optical characteristics of lens 111a or lens 131a.

Figure 2I:
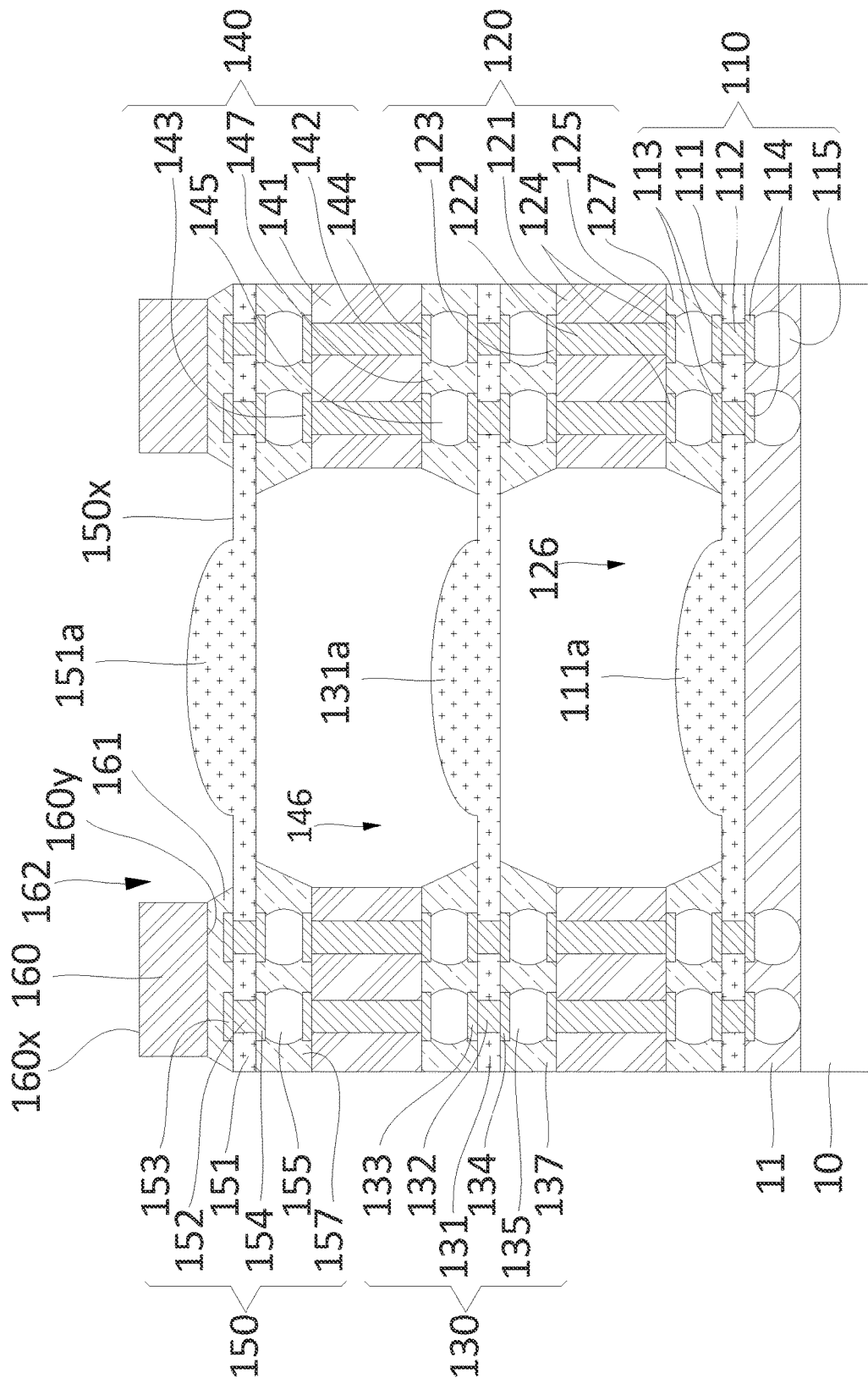

FIG. 2I shows a cross-sectional view of semiconductor device 1000 at a later stage of manufacture. In the example shown in FIG. 2I, lens protector 160 can be attached to lens substrate 150. In some examples, lens protector 160 can be over lens dielectric 111, 131, or 151 adjacent to lens 111a, 131a, or 151a.

Lens protector 160 can comprise lens cavity 162. Lens cavity 162 can be exposed at top side 160x and bottom side 160y of lens protector 160. In some examples, lens cavity 162 can be provided at a central portion of lens protector 160. Lens protector 160 can define a ring shape such as a circular ring or a rectangular ring. Lens protector 160 can expose lens 151a through lens cavity 162. Lens cavity 162 can have a width similar to spacer cavity 126.

In some examples, lens protector 160 can be picked up by pick-and-place equipment and then placed on a side of adhesive 161 provided to top side 150x of lens substrate 150. Bottom side 160y of lens protector 160 can be adhered to top side 150x of lens substrate 150 by adhesive 161. In some examples, lens protector 160 can have a thickness in the range of about 100 μm to about 100 mm. Lens protector 160 can prevent lens 151a from upwardly protruding to protect the top or sides of lens 151a. In some examples, adhesive 161 can comprise or be referred to as an epoxy material, a metallic material, or a KOVAR alloy. In some examples, adhesive 161 can be similar to underfill 127.

In some examples, lens protector 160 can be made of an electrically insulating material such as a polymer, or a conductive material such as a metal. Lens protector 160 can comprise or be referred to as a lens protection structure or a lens protection layer. In some examples, lens protector 160 can be similar to spacer substrate 120 or spacer substrate 140. For instance, lens protector 160 can comprise a dielectric wall similar to dielectric wall 121 or dielectric wall 141 of spacer substrates 120 or 140, though need not comprise vias like vias 122 or 142.

Figure 2J:
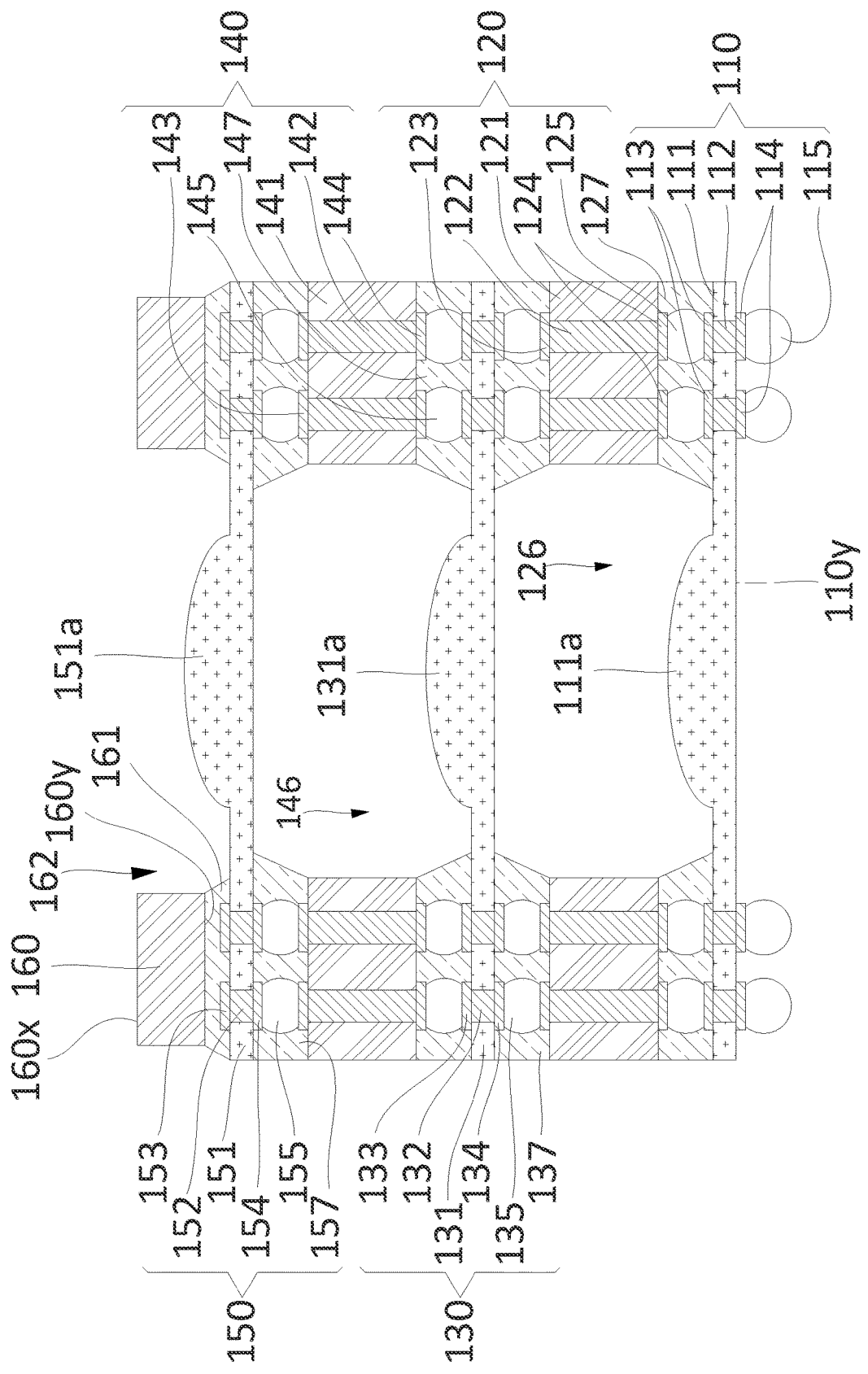

FIG. 2J shows a cross-sectional view of semiconductor device 1000 at a later stage of manufacture. In the example shown in FIG. 2J, carrier 10 can be removed from bottoms side 110y of lens substrate 110. Accordingly, bottom side 110y of lens substrate 110 and interconnects 115 can be exposed. In some examples, carrier 10 can be similarly removed as described with respect to carrier 20.

Figure 2K:
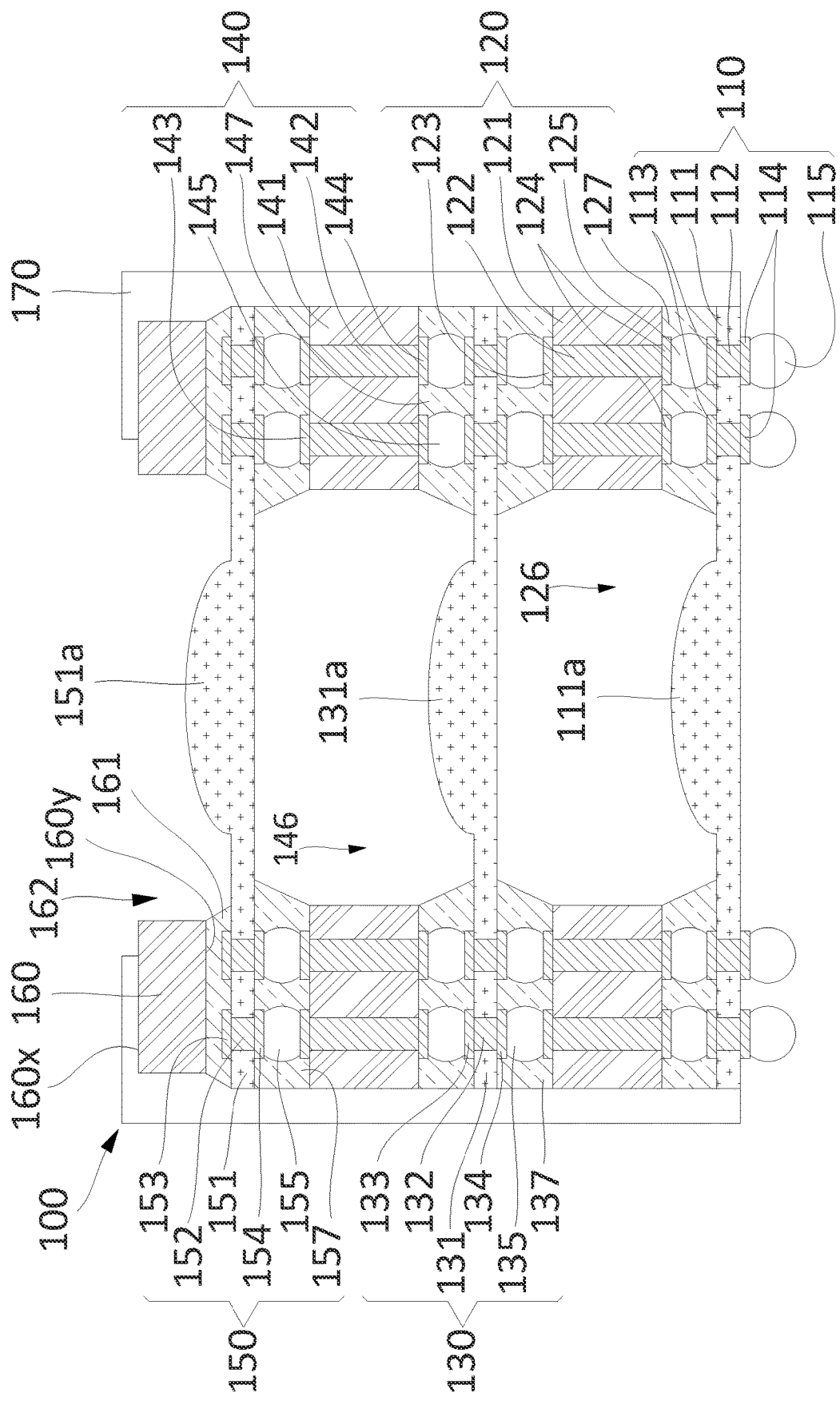

FIG. 2K shows a cross-sectional view of semiconductor device 1000 at a later stage of manufacture. In the example shown in FIG. 2K, encapsulant 170 can be provided to cover lens protector 160, lens substrates 110, 130, or 150, and spacer substrates 120 or 140. In some examples, encapsulant 170 can be brought into contact with top side 160x and lateral sides of lens protector 160. In some examples, encapsulant 170 can be brought into contact with lateral sides of lens substrates 110, 130, or 150 and external lateral sides of spacer substrates 120 or 140. In some examples, encapsulant 170 can be brought into contact with lateral sides of adhesive 161 and lateral sides of underfills 127, 137, 147, or 157. Lens 151a can remain exposed from encapsulant 170. In some examples, encapsulant 170 can contact a lateral side of lens substrate 110, 130, or 150 and a dielectric wall 121 or 141 of spacer substrate 120 or 140. In some examples, encapsulant 170 can be provided over a lateral side of lens substrate 150 and over a dielectric wall 141 of spacer substrate 140 or a dielectric wall 121 of spacer substrate 120.

In some examples, encapsulant 170 can comprise or be referred to as epoxy molding compound, epoxy molding resin, or dielectric encapsulant. In some examples, encapsulant 170 can be made of an opaque material. In some examples encapsulant 170 can comprise an organic resin, an inorganic filler, a curing agent, a catalyst, a coupling agent, a coloring agent, or a flame retardant. In some examples, encapsulant 170 can be provided by a compression molding process, a transfer molding process, a liquid phase encapsulant molding process, a vacuum lamination process, a paste printing process, or a film assisted molding process. Encapsulant 170 can have a thickness in the range of about 10 µm to about 100 mm. Encapsulant 170 can be provided to cover lens protector 160, lens substrates 110, 130, or 150 and spacer substrates 120 or 140, to protect lens protector 160, lens substrates 110, 130, or 150 and spacer substrates 120 or 140 from external elements or environmental exposure.

Encapsulant 170 can be provided to define lens unit 100. Lens unit 100 can comprise lens substrates 110, 130, or 150, spacer substrates 120 or 140, lens protector 160, and encapsulant 170. Lens unit 100 can be manufactured by the manufacturing method shown in FIGS. 2A to 2K.

Figure 2L:
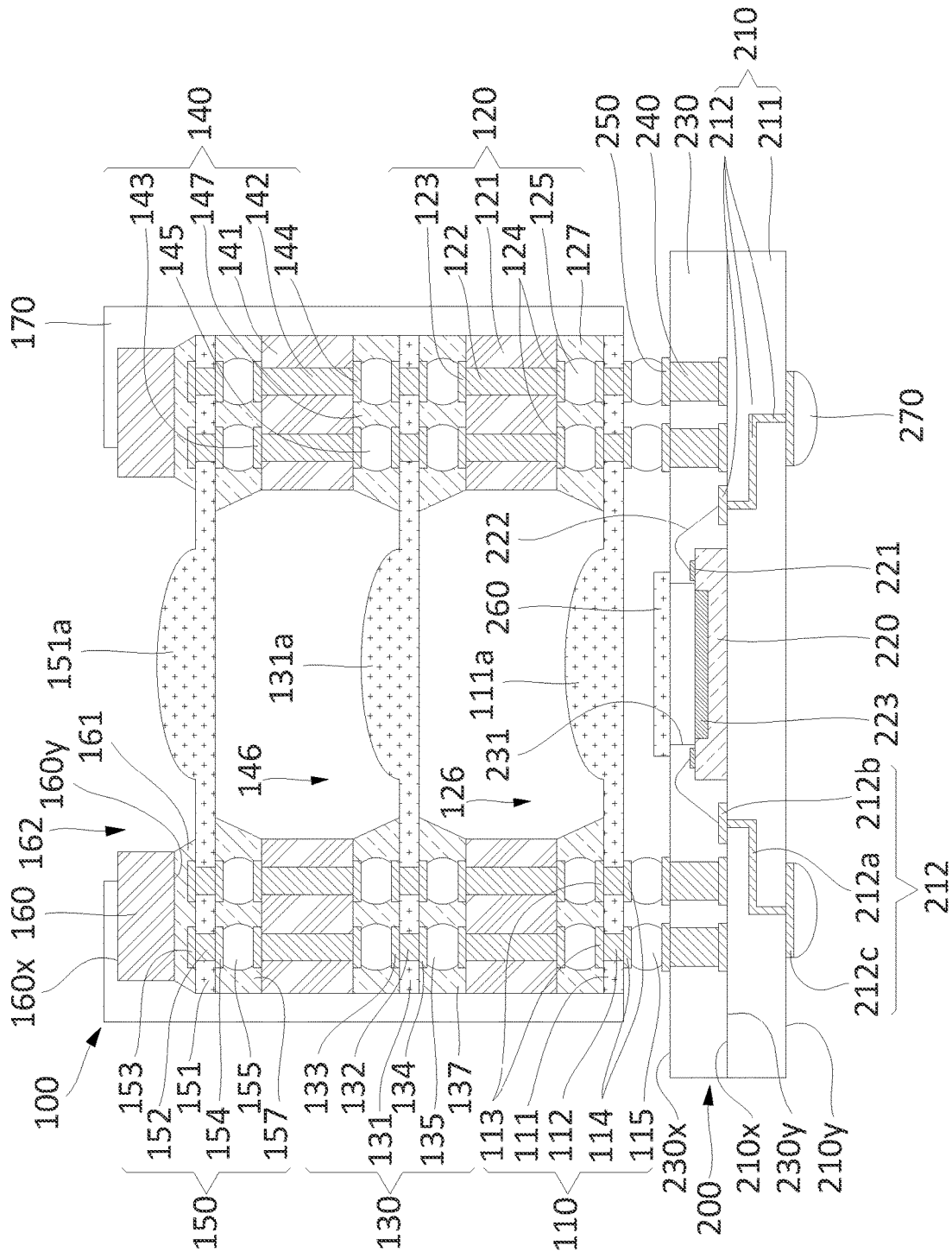

FIG. 2L shows a cross-sectional view of semiconductor device 1000 at a later stage of manufacture. In the example shown in FIG. 2L, interconnects 115 of lens unit 100 can be coupled to base top terminals 250 of base unit 200 and can couple base unit 200 with lens substrate 110. Lens unit 100 can be stacked on base unit 200.

In some examples, lens unit 100 can be picked up by pick-and-place equipment and then be placed on base top terminals 250 of base unit 200. Next, lens unit 100 can be connected to base unit 200 using a mass reflow process, a thermal compression process, or a laser assisted bonding process. Lens unit 100 can be automatically aligned on base unit 200 while interconnects 115 are connected to base top terminals 250. Accordingly, electronic component 220 can be aligned with lens 111a. Because interconnects 115 can couple lens unit 100 to base unit 200, interconnects 115 can be referred as base interconnects. Base unit 200 can comprise base substrate 210, electronic component 220, encapsulant 230, vertical interconnects 240, base top terminals 250, lid 260, or base bottom terminals 270.

Base substrate 210 can comprise dielectric structure 211 having one or more dielectric layers, and conductive structure 212 having multiple conductive paths, layers, or patterns on or through the one or more dielectric layers of dielectric structure 211. The top side and bottom side of dielectric structure 211 can be along top side 210x or bottom side 210y of base substrate 210. Conductive structure 212 can comprise conductive paths 212a between top side 210x and bottom side 210y, with conductive pads 212b and 212c provided at top side 210x or bottom side 210y of base substrate 210. In some examples, interconnect 115 can be coupled with lens bottom terminal 114 and encapsulant top terminal 250. In some examples, lid 260 can be over electronic component 220, or between electronic component 220 and lens 111a. In some examples, lens substrate 110, 130, or 150, or lens 111a, 131a, or 151a, can be over base unit 200. Base unit 200 can comprise a redistribution layer (RDL) base substrate 210, or can comprise a pre-formed base substrate 210.

In some examples, dielectric structure 211 can comprise or be referred to as one or more dielectric, solder mask, core, or prepreg layers. In some examples, dielectric structure 211 can comprise an epoxy resin, a phenol resin, glass epoxy, polyimide, polyester, an epoxy molding compound, or a ceramic.

In some examples, conductive structure 212 can comprise or be referred to as one or more conductive layers, traces, pads, terminals, UBMs, or vias. In some examples conductive structure 212 can comprise copper, iron, nickel, gold, silver, palladium, or tin.

In some examples base substrate 210 can comprise or be referred to as a printed circuit board, a cavity substrate, multi-layered substrate, a through hole substrate, a rigid substrate, a flexible substrate, a glass epoxy substrate, a polyimide substrate, a polyester substrate, a molded substrate, a ceramic substrate, an etched foil process substrate, an additive process substrate, a buildup substrate, or a pre-molded lead frame. In some examples, base substrate 210 can have a thickness in the range of about 1 µm to about 100 mm.

In some examples, base substrate 210 can comprise a redistribution layer ("RDL") substrate. RDL substrates can comprise one or more conductive redistribution layers and one or more dielectrics that (a) can be formed layer by layer over an electronic device where the RDL substrate is to be electrically coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectrics alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process, or an electroless plating process. The conductive patterns can comprise an electrically conductive material, for example copper or other plateable metal. The locations of the conductive patterns can be made using a photo-patterning process such as a photolithography process and a photoresist material to form a photolithographic mask. The dielectrics of the RDL substrate can be patterned with a photo-patterning process and can include a photolithographic mask through where light is exposed to photo-pattern desired features such as vias in the dielectrics. The dielectrics can be made from photo-definable organic dielectric materials, for example polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, where it could interfere with the light from the photo-patterning process. In some examples, such filler-free characteristics of filler-free dielectric materials can permit a reduction of the thickness of the resulting dielectric. Although the photo-definable dielectric materials described above can be organic materials, in other examples the dielectric materials of the RDL substrates can comprise one or more inorganic dielectrics. Some examples of one or more inorganic dielectrics can comprise silicon nitride (Si3N4), silicon oxide (SiO2), or silicon oxynitride (SiON).

The inorganic dielectric or dielectrics can be formed by growing the inorganic dielectrics using an oxidation or nitridization process instead using photo-defined organic dielectric materials. Such inorganic dielectrics can be filler-fee, without strands, weaves, or other dissimilar inorganic particles. In some examples, the RDL substrates can omit a permanent core structure or carrier, for example a dielectric material comprising bismaleimide triazine (BT) or FR4, and these types of RDL substrates can be referred to as a coreless substrate. Other substrates in this disclosure can also comprise an RDL substrate.

In some examples, base substrate 210 can be a pre-formed substrate. The pre-formed substrate can be manufactured prior to attachment to an electronic device and can comprise dielectrics between respective conductive layers. The conductive layers can comprise copper and can be formed using an electroplating process. The dielectrics can be relatively thicker non-photo-definable layers and can be attached as a pre-formed film rather than as a liquid and can include a resin with fillers such as strands, weaves, or other inorganic particles for rigidity or structural support. Since the dielectrics are non-photo-definable, features such as vias or openings can be formed by using a drill or laser. In some examples, the dielectrics can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

Electronic component 220 can have a bottom side bonded to top side 210x of base substrate 210 using an adhesive, and terminals 221 provided at top side of electronic component 220 and coupled to conductive pads 212b at top side 210x of base substrate 210 through internal interconnects 222. The top side of electronic component 220 can comprise interface element 223 electrically coupled to terminals 221. In some examples, interface element 223 can comprise or be referred to as an optical sensor or an optical emitter. In some examples, interface element 223 of electronic component 220 can sense or emit radiation, such as light, whether visible or invisible, through lid 260 and lenses 111a, 131a, and 151a of lens unit 100.

Terminals 221 of electronic component 220 can be input/output terminals of electronic component 220. Although terminals 221 are shown facing upward in a wire bonded configuration, in some examples terminals 221 can face downward in a flip-chip configuration. In some examples, terminals 221 can comprise or be referred to as die pads, bond pads, or bumps. In some examples, internal interconnects 222 of electronic component 220 can comprise or be referred to as wires or bumps. In some examples, internal interconnects 222 can comprise gold, aluminum, or copper. Electronic component 220 can be coupled to base bottom terminals 270 through internal interconnects 222 and conductive structure 212 of base substrate 210. In some examples, electronic component 220 can comprise or be referred to as a die, a chip, a package, a sensor, or an emitter.

Electronic component 220 can have a width in the range of about 100 μm to about 100 mm and a thickness in the range of about 1 μm to about 10 mm.

Encapsulant 230 can be provided to cover electronic component 220 and top side 210x of base substrate 210. Encapsulant 230 can be brought into contact with side sides of electronic component 220 and can also be brought into contact with terminals 221 and internal interconnects 222. Encapsulant 230 can be brought into contact with top side 210x of base substrate 210. Encapsulant 230 can comprise cavity 231 exposing interface element 223 at the top side of electronic component 220. Encapsulant 230 can be similar to encapsulant 170 with respect to corresponding features, elements, materials, or formation. Encapsulant 230 can have a thickness in the range of about 1 μm to about 1,000 μm.

Vertical interconnects 240 can be exposed at top side 230x and bottom side 230y of encapsulant 230 and can be coupled with conductive pads 212b of base substrate 210. In some examples, vertical interconnects 240 can be similar to vias 112, 122, or 142 with respect to corresponding features, elements, materials, or formation. In some examples, vertical interconnects 240 can be provided using electroplating, electroless plating, sputtering, wirebonding, PVD, CVD, MOCVD, ALD, LPCVD, or PECVD. In some examples, vertical interconnects 240 can comprise or be referred to as pillars, posts, vias, or vertical wires. Vertical interconnects 240 can have a thickness in the range of about 1 μm to about 10 mm and a height similar to encapsulant 230.

Base top terminals 250 can be coupled to vertical interconnects 240 exposed at top side 230x of encapsulant 230. Base top terminals 250 can comprise or be referred to as pads, under-bump-metallurgies (UBMs), or as top sides of vertical interconnects 240. In some examples, base top terminals 250 can be similar to lens terminals 113 or 114 or spacer terminals 123 or 124 with respect to corresponding features, elements, materials, or formation.

Lid 260 can be bonded adjacent to top side 230x of encapsulant 230 using a lid seal or adhesive. In some examples, encapsulant 230 can comprise a ledge into top side 230x, and the ledge can support the perimeter of lid 260. In some examples, the bottom side of lid 260 can extend lower than top side 230x of encapsulant 230. Lid 260 can be placed by pick-and-place equipment on encapsulant 230, where interface element 223 of electronic component 220 can be positioned under lid 260. Lid 260 can be separated from interface element 223 of electronic component 220 by encapsulant 230. In some examples, lid 260 can comprise or be referred to as a translucent, whether fully or partially transparent, permeable, or glass material. Lid 260 can have a thickness in the range of about 1 μm to about 10 mm.

Base bottom terminals 270 can be coupled to conductive pads 212c of base substrate 210. Base bottom terminals 270 can be coupled to electronic component 220 through base substrate 210 and internal interconnects 222. In some examples, base bottom terminals 270 can be similar to interconnects 115 with respect to corresponding features, elements, materials, or formation. In some examples, base bottom terminals 270 can be referred to as external input/output terminals of semiconductor device 1000.

Figure 2M:
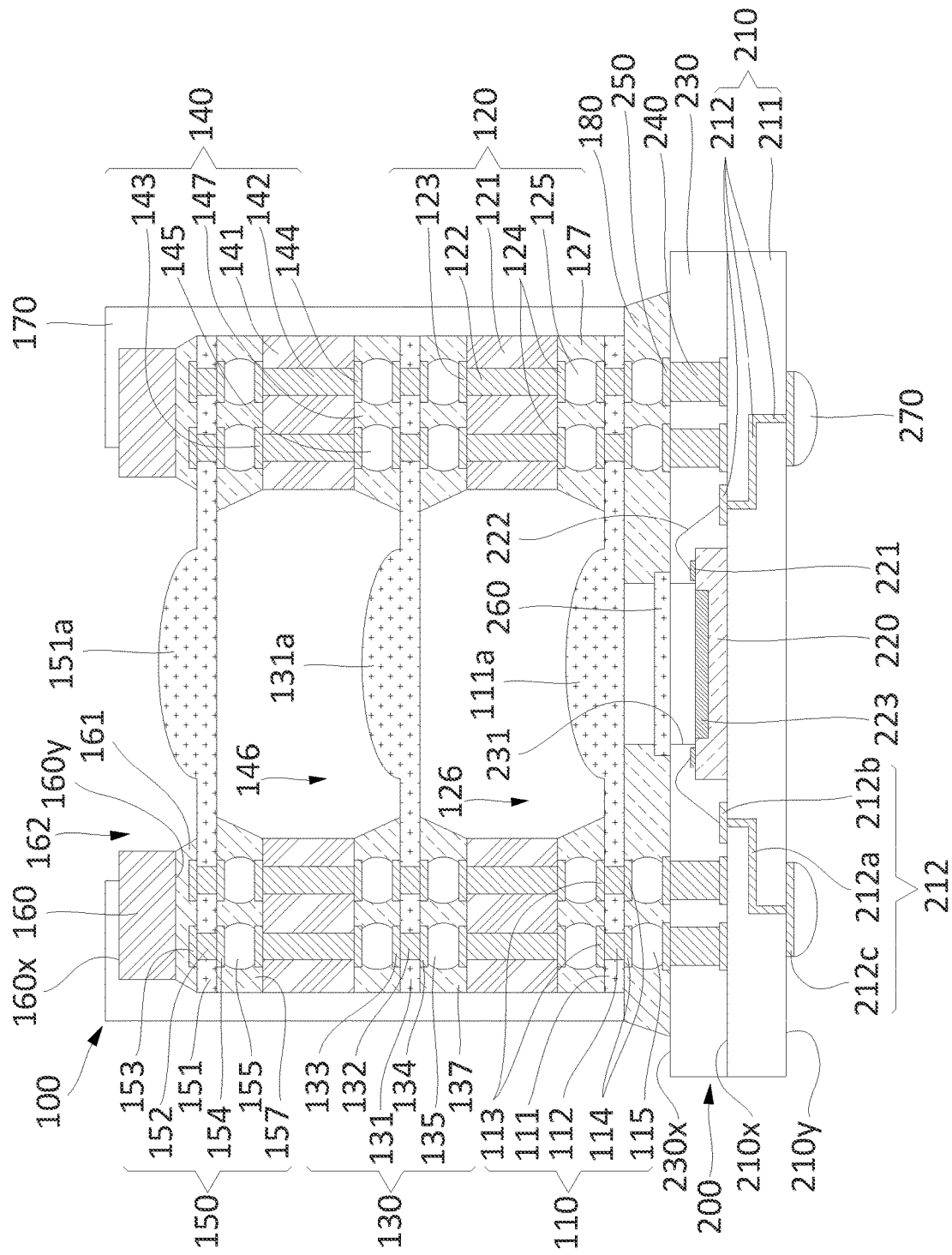

FIG. 2M shows a cross-sectional view of semiconductor device 1000 at a later stage of manufacture. In the example shown in FIG. 2M, underfill 180 can be provided between base unit 200 and lens unit 100, for example between base unit 200 and lens substrate 110. In some examples, underfill 180 can be injected or absorbed into a gap between top side of base unit 200 and bottom side of lens unit 100, and then be cured. Underfill 180 can be positioned between top side 230x of encapsulant 230 of base unit 200 and bottom side 110y of lens substrate 110. In some examples, underfill 180 can define a cavity, aligned with lens 110a and interface element 223, between lid 260 and lens substrate 110. Underfill 180 is shown extending to contact a perimeter of lid 260, but in some examples underfill 180 need not extend to reach lid 260. A bottom side of lens 110a of lens substrate 110 and the top side of lid 260 can face each other. Underfill 180 can prevent lens unit 100 from being electrically disconnected from base unit 200 due to physical or chemical shocks. In some examples, underfill 180 can be similar to underfill 127.

In some examples, lens substrate 150 can be over spacer substrate 140, spacer substrate 140 can be over lens substrate 130, lens substrate 130 can be over spacer substrate 120, and spacer substrate 120 can be over lens substrate 110, to provide lens 151a over lens 131a, and lens 131a over lens 111a. Lens 111a can be over or aligned with interface element 223 of electronic component 220. In some examples, lenses 111a, 131a, or 151a can be aligned with each other and can also be aligned with interface element 223 of electronic component 220.

Figure 3:
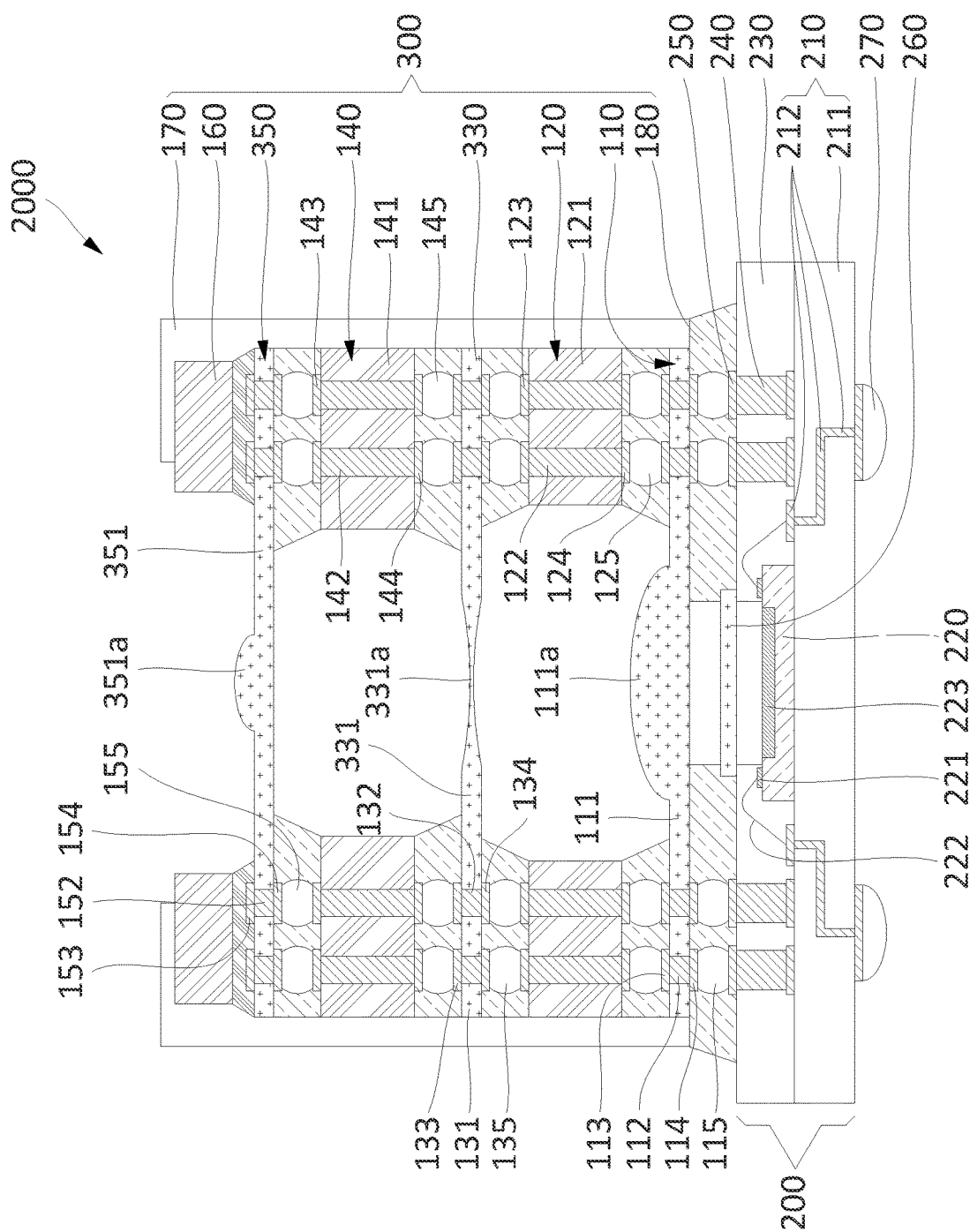
FIG. 3 shows a cross-sectional view of an example semiconductor device.

FIG. 3 shows a cross-sectional view of an example semiconductor device 2000. In the example shown in FIG.3, semiconductor device 2000 can comprise lens unit 300 and base unit 200. Lens unit 300 can comprise lens substrates 110, 330, or 350, spacer substrates 120 or 140, lens protector 160, encapsulant 170, and underfill 180. Lens substrates 330 or 350 can comprise dielectrics 331 or 351, vias 132 or 152, lens top terminals 133 or 153, lens bottom terminals 134 or 154, or interconnects 135 or 155. Dielectrics 331 or 351 can comprise or be coupled to lenses 331a or 351a.

Semiconductor device 2000 can be similar to semiconductor device 1000 with respect to corresponding features, elements, materials, or formation. For example, lens unit 300 can be similarly to lens unit 100 as described in FIGS. 2A to 2K and can comprises lenses 331a or 351a of lens unit 300.

Lenses 111a, 331a, and 351a are exemplary lenses illustrated to highlight that different lenses of lens unit 300, like those of lens unit 100, can have different optical characteristics. For example, lens 331a of lens unit 300 can have a smaller width than lens 111a. Lens 131a can be a convex lens shaped to protrude from lens substrate 110, and lens 331a can be a concave lens shaped to be recessed into lens substrate 330. Lens 531a can have a smaller width than lens 331a. Lenses 111a, 331a, and 531a of such lens unit 300 can have widths and shapes varied in various manners.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A method to manufacture a semiconductor device, comprising:
providing a first lens substrate comprising a first lens dielectric and having a first lens;
providing a first spacer substrate facing the first lens substrate, wherein the first spacer substrate comprises spacer cavity at a central portion of the first spacer substrate;
coupling the first lens substrate and the first spacer substrate with a first interconnect, wherein the first interconnect is between a top side of the first lens substrate and a bottom side of the first spacer substrate;
wherein:
the first lens substrate comprises a first lens via, and a first lens terminal coupled to the first lens via;
the first spacer substrate comprises a first spacer via, and a first spacer terminal coupled to the first spacer via; and
the first interconnect couples the first lens terminal with the first spacer terminal;
providing a base unit comprising a base unit dielectric structure, a base unit encapsulant over the base unit encapsulant, and an electronic component in the base unit encapsulant and external to the first lens substrate, wherein the base unit is spaced apart from the first lens substrate;
coupling the base unit and the first lens substrate with a base interconnect between the base unit encapsulant and the first lens substrate;
providing a device encapsulant covering a lateral side of the first lens substrate and covering an exterior lateral dielectric wall of the first spacer substrate;
providing a first underfill between the first lens substrate and the first spacer substrate, wherein the first underfill covers the first interconnect, wherein the first underfill is exterior to the first lens substrate; and
providing a second underfill between the base unit encapsulant and the first lens substrate, wherein the second underfill covers the base interconnect, wherein the second underfill is exterior to the base unit encapsulant;
wherein the base interconnect is external to the base unit and external to the first lens substrate;
wherein the coupling with the base interconnect aligns the electronic component with the first lens; and
wherein the first lens and the first lens dielectric comprise a same material.

2. A method to manufacture a semiconductor device, comprising:
providing a spacer substrate comprising,
a spacer dielectric;
a spacer top terminal on a top side of the spacer substrate;
a spacer bottom terminal on a bottom side of the spacer substrate;
a spacer via in the spacer dielectric and coupled with the spacer top terminal and the spacer bottom terminal; and
a spacer cavity at a central portion of the spacer substrate;
providing a first lens substrate over the spacer substrate, the first lens substrate comprising,
a first lens dielectric;
a first lens contacting the first lens dielectric;
a first lens top terminal on a top side of the first lens dielectric;
a first lens bottom terminal on a bottom side of the first lens dielectric; and
a first lens via in the first lens dielectric and coupled with the first lens top terminal and the first lens bottom terminal;
providing a first interconnect between the spacer top terminal and the first lens bottom terminal and coupled with the spacer top terminal and the first lens bottom terminal;

providing a lens protector over the first lens dielectric adjacent to the first lens, wherein the lens protector is spaced apart from the first lens, and wherein the lens protector does not contact the first lens;

providing a base substrate, wherein the first lens substrate is over the base substrate and spaced apart from the base substrate, the base substrate comprising:
a dielectric structure;
a conductive structure in the dielectric structure;
a base encapsulant over the dielectric structure and external to the first lens substrate; and
an electronic component over the dielectric structure and in the base encapsulant; and providing a second lens substrate, wherein the spacer substrate is over the second lens substrate, the second lens substrate comprising:
a second lens dielectric;
a second lens over the second lens dielectric;
a second lens top terminal on a top side of the second lens dielectric;
a second lens bottom terminal on a bottom side of the second lens dielectric; and
a second lens via in the second lens dielectric and coupled with the second lens top terminal and the second lens bottom terminal; and providing a second interconnect coupled with the second lens top terminal and the spacer bottom terminal;

wherein the first lens dielectric is over the second lens dielectric;

wherein the electronic component is external to the first lens substrate and coupled with the conductive structure;

wherein the spacer substrate is over the base substrate; and wherein the first lens and the first lens dielectric comprise a same material.

3. The method of claim 2, further comprising:
providing a device encapsulant contacting a lateral side of the first lens substrate, and a dielectric wall of the spacer substrate.

4. The method of claim 2, further comprising:
providing an encapsulant top terminal on a top side of the base encapsulant;
providing an encapsulant via in the base encapsulant coupled with the encapsulant top terminal; and
providing a second interconnect coupled with the spacer bottom terminal and the encapsulant top terminal;
wherein the spacer substrate is over the base encapsulant.

5. The method of claim 2, further comprising:
providing a lid over the electronic component between the electronic component and the first lens.

6. A method of manufacturing a semiconductor device, comprising:
providing a first lens substrate, comprising:
a first lens dielectric;
a first lens over the first lens dielectric; and
a lens top terminal on a top side of the first lens dielectric;

providing a spacer substrate over the first lens substrate, the spacer substrate comprising:
a spacer dielectric;
a spacer cavity at a central portion of the spacer substrate;
a spacer top terminal; and
a spacer bottom terminal;

providing a second lens substrate over the spacer substrate, the second lens substrate comprising:
a second lens dielectric;
a second lens over the second lens dielectric and contacting the second lens dielectric; and
a lens bottom terminal on a bottom side of the second lens dielectric;

providing a first interconnect coupled with the lens top terminal and the spacer bottom terminal;

providing a second interconnect coupled with the spacer top terminal and the lens bottom terminal;

providing a base unit, wherein the first lens substrate is over the base unit, a base top terminal on a top side of the base unit;

providing a third interconnect coupled with the base top terminal and a first lens substrate bottom terminal on a bottom side of the first lens dielectric;

providing an electronic component in the base unit and external to the first lens substrate and having an optical interface element on the top side of the electronic component, wherein the optical interface element is inside the base unit;

providing an encapsulant contacting a lateral side of the first lens substrate, a lateral side of the second lens substrate, and a lateral dielectric wall of the spacer substrate; and providing a lens protector on a top side of the second lens substrate and adjacent to the second lens;

wherein the first lens has a first optical characteristic, and the second lens has a second optical characteristic different than the first optical characteristic;

wherein the first lens and the second lens are uncovered by the encapsulant; and wherein the first lens and the first lens dielectric comprise a same material.

7. The method of claim 6, further wherein:
the encapsulant contacts a top side of the lens protector.

8. The method of claim 6, wherein the base unit comprises a redistribution layer (RDL) substrate.

9. The method of claim 6, wherein the base unit comprises a pre-formed substrate.

10. The method of claim 6, further comprising:
providing an underfill between the base unit and the first lens substrate.

* * * * *